United States Patent
Jin et al.

[11] Patent Number: 5,684,328
[45] Date of Patent: Nov. 4, 1997

[54] SEMICONDUCTOR CHIP PACKAGE USING IMPROVED TAPE MOUNTING

[75] Inventors: Ho Tae Jin; In Pyo Hong; Chang Eui Ko, all of Suwon,, Rep. of Korea

[73] Assignee: Samsung Electronics Co., Ltd., Kyungki-do, Rep. of Korea

[21] Appl. No.: 684,989

[22] Filed: Jul. 22, 1996

Related U.S. Application Data

[63] Continuation of Ser. No. 431,457, May 1, 1995, abandoned, which is a continuation of Ser. No. 97,995, Jul. 29, 1993, abandoned.

[30] Foreign Application Priority Data

Jul. 29, 1992 [KR] Rep. of Korea ............ 92-13590

[51] Int. Cl.$^6$ .............. H01L 23/495; H01L 23/52
[52] U.S. Cl. .............. 257/669; 257/676; 257/691; 257/783
[58] Field of Search .............. 257/669, 676, 257/783, 666, 691

[56] References Cited

U.S. PATENT DOCUMENTS

| | | | |
|---|---|---|---|
| 4,884,124 | 11/1989 | Mori et al. | 257/783 |
| 4,916,519 | 4/1990 | Ward | 257/666 |
| 4,949,158 | 8/1990 | Ueda | 257/783 |
| 4,965,654 | 10/1990 | Karner et al. | 257/783 |
| 5,227,661 | 7/1993 | Heinen | 257/669 |
| 5,264,730 | 11/1993 | Matsuzaki et al. | 257/783 |
| 5,291,060 | 3/1994 | Shimizu et al. | 257/667 |
| 5,381,036 | 1/1995 | Bigler et al. | 257/666 |
| 5,391,916 | 2/1995 | Kohno et al. | 257/676 |
| 5,432,380 | 7/1995 | Jin et al. | 257/676 |

FOREIGN PATENT DOCUMENTS

| | | | |
|---|---|---|---|
| 0219463 | 10/1987 | Japan | 257/783 |
| 0293964 | 11/1988 | Japan | 257/783 |
| 0106455 | 4/1989 | Japan | 257/783 |
| 0147836 | 6/1989 | Japan | 257/783 |
| 0154545 | 6/1989 | Japan | 257/783 |
| 0280343 | 11/1989 | Japan | 257/666 |
| 0293642 | 11/1989 | Japan | 257/783 |
| 0232957 | 9/1990 | Japan | 257/666 |

OTHER PUBLICATIONS

William C Ward, Volumn Production of Unique Plastic Surface–Mount Modules for the IBM 80–NS 1–MBIT DRAM Chip by area Wire Bond Techniques, IBM General Technology Division, Essax Junction, Vermont, pp. 552–557.

*Primary Examiner*—Tom Thomas
*Assistant Examiner*—David Ostrowski
*Attorney, Agent, or Firm*—Cushman Darby & Cushman Intellectual Property Group of Pillsbury Madison & Sutro LLP

[57] ABSTRACT

An LOC type semiconductor package and a fabricating method thereof comprises first and second through holes formed at inner leads and bus bars of the LOC-type lead frame, and third through holes formed at the tape which is bonded with the lower side of the inner leads and the bus bars, by pins at a tape cutter. Thus, air existing at both tape during the bonding process effectively flows out so as to prevent the trapping of air bubbles. Accordingly, during the wire bonding process, wire shorting and damage to the package body can be prevented. Since EMC is deposited into the first and the second through holes and supports the inner leads and the bus bars during the molding of the semiconductor package, the reliability of the semiconductor package can be improved.

15 Claims, 3 Drawing Sheets

SEMICONDUCTOR CHIP PACKAGE USING IMPROVED TAPE MOUNTING

This is a continuation of application Ser. No. 08/431,457, filed on May 1, 1995, which was abandoned upon the filing hereof, which is a continuation of application Ser. No. 08/097,995, filed Jul. 29, 1993 (abandoned).

BACKGROUND OF THE INVENTION

The present invention relates to a semiconductor package and fabricating method, and more particularly, to a semiconductor package and fabricating method thereof which improves operational reliability by preventing air bubbles from being trapped at both sides of a polyimide tape used in a lead on chip (LOC) method to mount a semiconductor chip on inner leads and bus bars of a lead frame having no die pad.

In general, a semiconductor package is called a hermetic sealing instrument of semiconductor chips such as transistors, diodes, and integrated circuit (IC). Semiconductor chips are hermetically sealed since their operational characteristics are degraded when humidity or dust adheres to or otherwise contaminates their surface. Also, a semiconductor chip, such as a planar type transistor which has a stabilized surface can be molded not by hermetic sealing but by an epoxy polyimide tape. And, even in that case, it is called a semiconductor package. The semiconductor package protects not only the surface of the semiconductor chip from external humidity or dust but also the semiconductor chip and slender leads extending therefrom damaging external forces. In power semiconductor devices, the semiconductor packages are ideally designed to effectively emit heat generated at a junction. On the other hand, in diffusion transistors, such as mesa and planar type transistors, the semiconductor chip itself becomes the collector.

In a conventional LOC semiconductor package, as shown in FIG. 1, a lead frame 10 without a die pad is used. Leads 12 have inner leads 14 and outer leads 16. Bus bars 18 extend from corners of the lead frame 10.

Referring to FIGS. 2-4, a tape bonding process of the LOC semiconductor package using the conventional lead frame 10 of FIG. 1 is now described in detail.

First, as shown in FIG. 3, an adhesively double-faced die-bonding polyimide tape 30 is arranged under the inner leads 14 and bus bars 18 shown in FIG. 1. The polyimide tape 30 is cut to form cut tape portions 32, each of which is fitted to the size of the inner leads 14 and the bus bars 18 by a tape cutter 20 which has a rectangular-type blade 24 protruding from a cutter body 22 as shown in FIGS. 2A and 2B. The tape portions 32 are then adhesively bonded to the inner leads 14 and bus bars 18. At that time, as shown in FIG. 4, a heater block 42 installed over the lead frame 10 bonds the polyimide tape 30 completely by heating. The process is progressed with winding the polyimide tape 30 from the first reel 44 to the second reel 46. After the bonding process, a piercing hole is formed at the center of the tape wound at the second reel 46, as shown in FIG. 3. Next, the semiconductor chip (not shown) is bonded to the tape 30 at the back side of the inner lead 14 and the bus bars 18, followed by wire-bonding and molding. At that time, the semiconductor chip has bonding pads at its center.

In the above conventional LOC package and fabricating process thereof, when the tape is bonded with the inner leads and the bus bars, air does not flow out. Also, during bonding process of the semiconductor chip and the tape, air remains underneath the tape and forms an air bubble, because there is no outflow path of air. The air between the edge of the semiconductor chip and the tape flows out but the air between the center of the tape and the semiconductor chip remains because the outflow speed of air is slower than the bonding speed. The air bubble becomes the source of shorting problem in wire bonding process and damages the package body in molding process, degrading the reliability of the semiconductor package.

SUMMARY OF THE INVENTION

An object of the present invention is to provide a semiconductor package which prevents the shorting of wires in the semiconductor package and damage to the package body due to air bubbles trapped by a mounting tape, by effectively allowing the trapped air to be released.

Another object of the present invention is to provide a method for fabricating a semiconductor package which effectively releases trapped air at both sides of a mounting tape of an LOC semiconductor package.

According to the present invention, a semiconductor package having inner and outer leads is provided which has a polyimide tape bonded with a part of the inner leads so that air trapped between the inner leads and the chip easily flows out.

According to the present invention, a method for fabricating the semiconductor package is also provided such that the tape is bonded with one side of the inner leads and the chip is attached on the tape, comprising following process steps of:

(a) arranging the tape on the lead frame where a plurality of first through holes are formed;
(b) cutting the tape;
(c) forming a plurality of second through holes;
(d) bonding the tape to a predetermined portion of the inner leads of the lead frame;
(e) mounting the chip on the tape;
(f) wire-bonding the pads of the chip with the inner leads; and
(g) forming a package body to protect the chip and wires.

DETAILED DESCRIPTION OF THE INVENTION

The present invention will be now described in more detail with reference to accompanying drawings.

Figure 1:
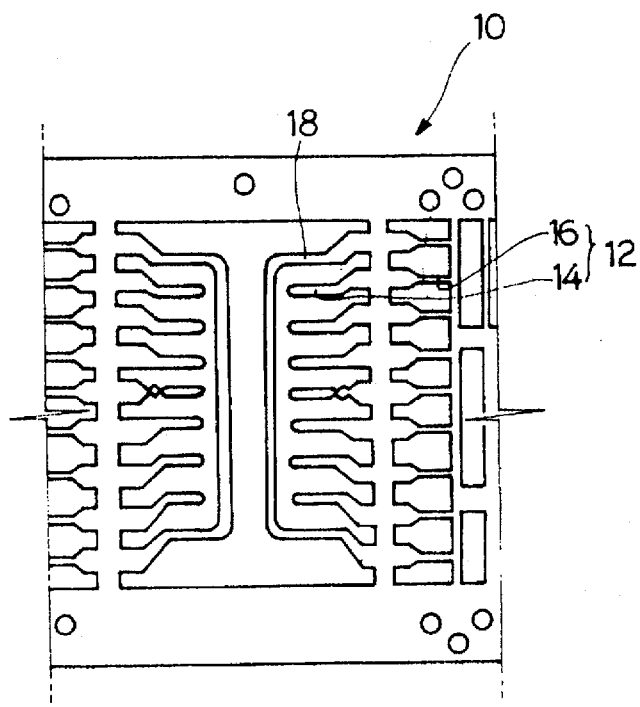
FIG. 1 is a top plan view of a lead frame for a conventional semiconductor package.
Figure 2A:
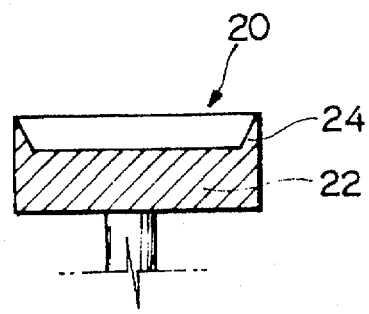
FIGS. 2A and 2B are cross-sectional and plan views, respectively, of a conventional bonding tape cutter.
Figure 2B:
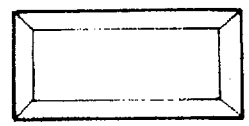
Figure 3:
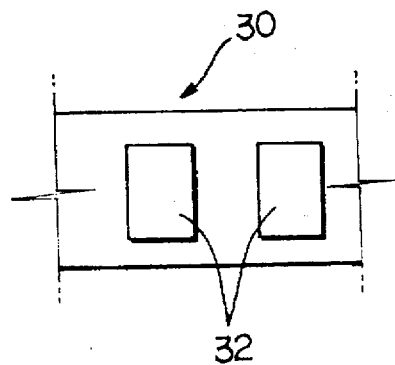
FIG. 3 is a plane view of a tape after tape cutting process by the tape cutter of FIG. 2.
Figure 4:
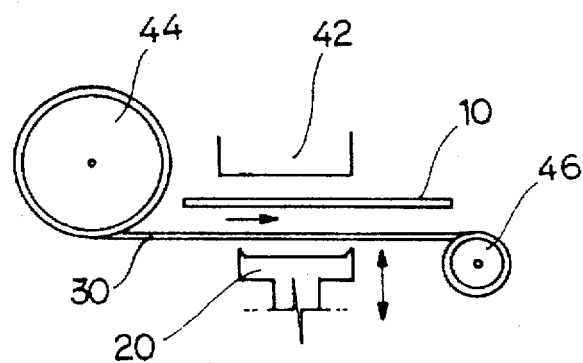
FIG. 4 illustrates a conventional tape bonding process.
Figure 5:
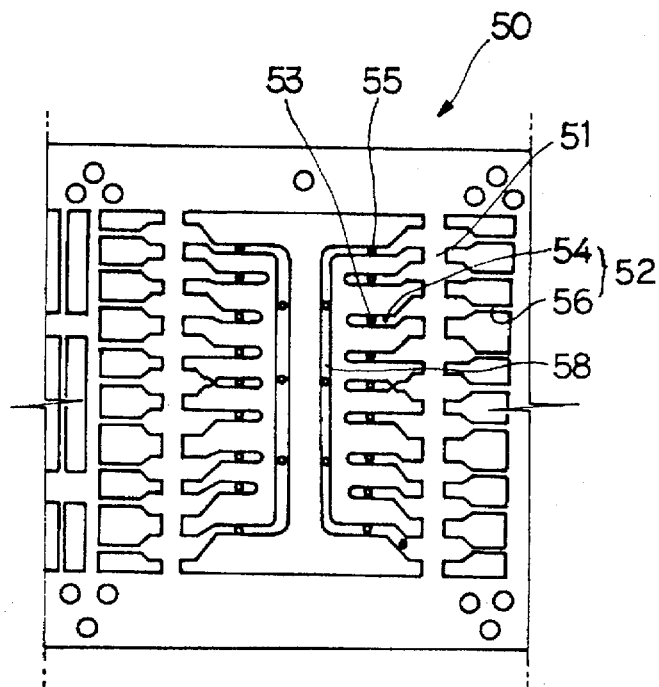
FIG. 5 is a plan view of a lead frame for a semiconductor package according to the present invention.

FIG. 5 is a plan view of a lead frame 50 of a LOC semiconductor package according to the present invention.

Figure 6A:
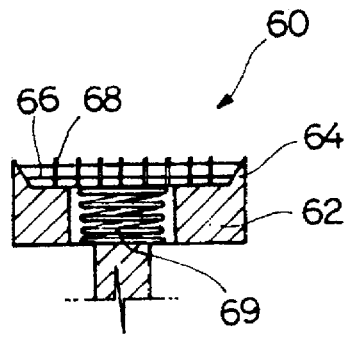
FIGS. 6A and 6B are cross-sectional and plan views, respectively, of a tape cutter according to the present invention.
Figure 6B:
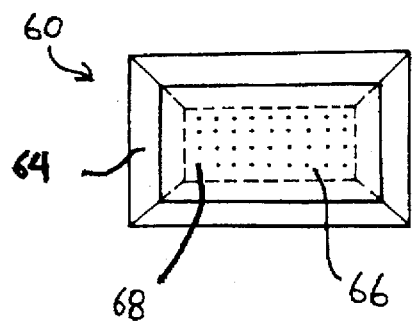

Leads 52 comprise inner leads 54, which are connected with a semiconductor chip (not shown), and outer leads 56, with a predetermined distance therebetween. The leads 54 and 56 are connected to each other by a dam bar 51 formed at the border of the inner and outer leads 54 and 56. The dam bar 51 is removed in a trimming process after a subsequent molding process. In addition, bus bars 58 partially surround the inner leads 54 on respective sides of lead frame 50. First and second through holes 53 and 55, respectively, are formed in inner leads 54 and bus bars 56 where the chip is mounted. The through holes 53 and 55 are formed by a punching process or a chemical etching process. The through holes are used as an air outflow path when the tape (not shown) and the chip are bonded. Also, a tape cutter 60 has a cutting portion such as a sharp blade 64 or puncturing structure about a periphery of its body 62 for cutting the mounting tape, as shown in FIGS. 6A and 6B. A thin plate 66 is formed within the periphery of blade 62. Vertically-movable pins are formed in plate 66. The pins 68 are fixed in corresponding holes therein (not shown). A spring 69 is disposed under the pins 68 which is movable upwardly and downwardly by an electrical solenoid or other suitable switched mechanism (not shown).

Figure 7:
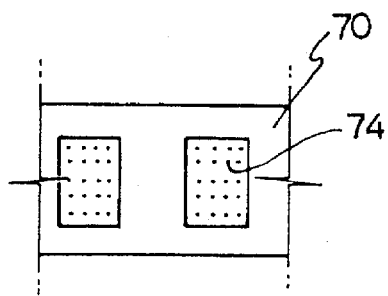
FIG. 7 is a plan view of the tape on which a plurality of through holes are formed by the tape cutter of FIG. 6.
Figure 8:
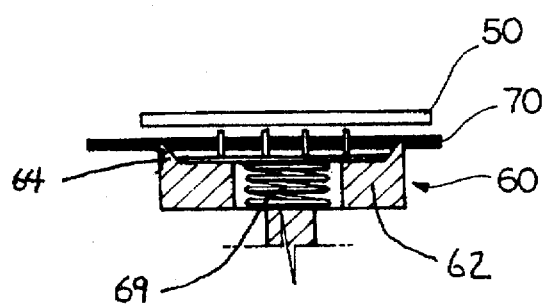
FIG. 8 illustrates part of a tape bonding process using the tape cutter of FIG. 6.

The tape bonding process using the tape cutter shown in FIG. 6 is described with reference to FIG. 7 and FIG. 8.

After arranging bonding tape 70 under the LOC lead frame 50, tape cutter 60 is moved upwardly so that the cutter blade 64 protruding from the cutter body 62 cuts the tape 70 in a predetermined manner. At the same time, the pins 68 which are in contact with the spring 69 are moved by on/off operation of the solenoid (or other suitable mechanism) so that third through holes 74 with a predetermined diameter are formed in the tape 70.

Afterwards, not shown in drawing, the tape 70 is subsequently moved between supply and take-up portions then heated by a conventional heater to complete a bonding process.

Figure 9:
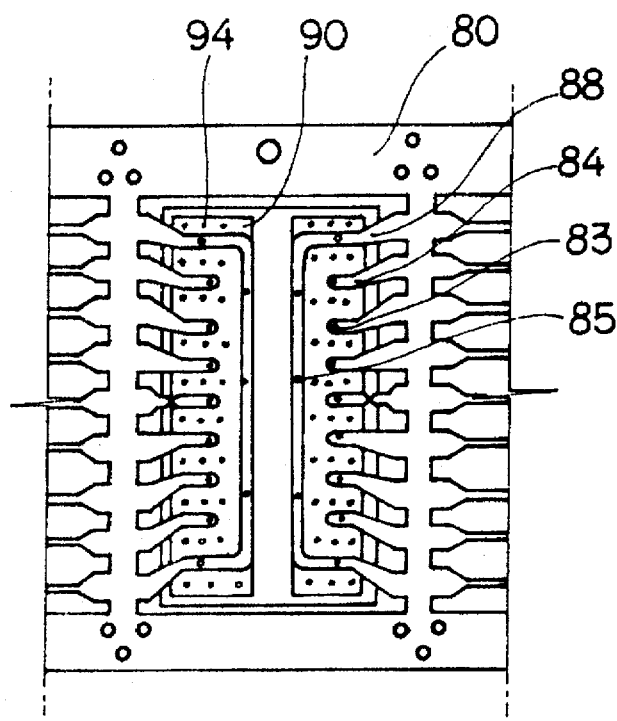
FIG. 9 is a plan view of a lead frame which is bonded with the tape processed by the tape cutter, according to the present invention.

FIG. 9 is a plan view of a lead frame 80 which is bonded with a cut tape portion 90 by the tape cutter 60.

First through holes 83 are formed on a predetermined part of inner leads 84 and second through holes 85 are also formed on a predetermined part of the bus bars 88. A cut polyimide tape portion 90 having third through holes 94 therethrough is bonded with a lower side of each of the inner leads 84 and the bus bars 88. The center exposed part of the cut tape portion 90 corresponds to the position of bonding pads of the semiconductor chip.

The diameter of the first through holes 83 formed in the inner leads 84 is less than the width of the inner leads 84 and the diameter of the second through holes 85 is less that the width of the bus bars 88. Also, the diameter of the pins 68 of the tape cutter 60 is properly determined so that the third through holes 94 have a diameter of about 0.01~0.50 mm to satisfactorily permit trapped air to flow out. The number of the first, second, and third through holes 83, 85, and 94 formed in the inner leads 84, the bus bars 88, and the tape 90 is determined according to the particular circumstances of width, length, and thickness.

Figure 10:
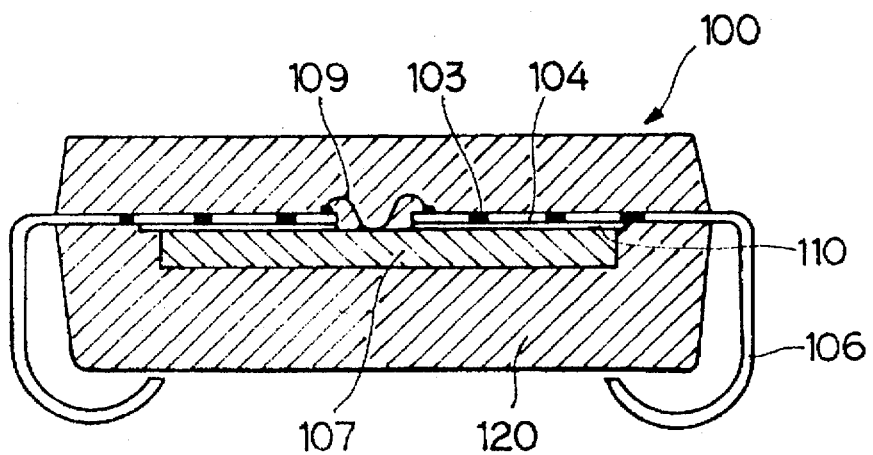
FIG. 10 is a cross-sectional view of a semiconductor package according to the present invention.

FIG. 10 is a cross-sectional view of the semiconductor package 100 according to the present invention.

First, the lead frame having a plurality of first through holes 103 in the inner leads and bus bars are arranged on the adhesively double-faced polyimide bonding tape 110. After cutting the tape 110 by the tape cutter and forming third through holes (not shown here) in tape 110, the tape 110 is bonded with the lower side of the inner leads and bus bars. At that time, air existing between the inner leads and bus bars flows out through the first and second through holes formed in the inner leads and the bus bars, and the tape, respectively. By heating (e.g., at about 250° C.) using a conventional heater, the tape 110 is completely bonded with the inner leads and the bus bars of the lead frame. Next, a semiconductor chip 107 is bonded with the lower side of the tape 110. At that time, the air existing between the tape 110 and the semiconductor chip 107 rapidly flows out through the second through holes. After bonding the semiconductor chip 107 and the tape 110 completely by heating (e.g., at 250° C.), the bonding pads of the chip (not shown) are connected with the inner leads 104 by a conventional wiring process. Next, a package body 120 is formed by sealing the semiconductor chip 107 and wiring 109 with polyimide. At that time, EMC is deposited in the first and second through holes 103 formed at the inner leads 104 and the bus bars, to reinforce them. Finally, the external leads 106 is bent (e.g., in a shape of a"J") after a conventional trimming process.

As described hereinabove, according to the present invention, a plurality of first and the second through holes are formed at the inner leads and the bus bars, respectively, of a LOC-type lead frame, and a plurality of third through holes are formed in a tape which is bonded with a lower side of the inner leads and bus bars by pins of a tape cutter. Any trapped air on either side of the tape (i.e., the side facing the lead frame or the side facing the chip) effectively flows out through the through holes during the bonding process, thus preventing the generation of the air bubbles underneath the tape. Accordingly, shorting between wires on the lead frame and chip and damage to a chip package body during the wire bonding process are prevented, and the structural reliability of the semiconductor package is improved since EMC is deposited in the first and second through holes during the package molding process to reinforce the inner leads and the bus bars after the mounting process is completed.

What is claimed is:

1. A semiconductor chip package comprising:
   a lead frame lacking a die pad but having a plurality of inner leads;
   a semiconductor chip having a first surface with a circuit pattern and a second surface opposite to said first surface, said semiconductor chip being mounted on said lead frame with an adhesive mounting tape portion having first and second adhesive sides, said first adhesive side being adhered to said lead frame, said adhesive mounting tape having a plurality of first through holes formed therethrough, said second adhesive side being adhered to said first surface of said semiconductor chip, said semiconductor chip being electrically connected to said plurality of inner leads, at least some of the holes through said tape being not aligned with the leads or holes through the leads; and
   a molding compound portion encapsulating said semiconductor chip and at least a portion of said lead frame.

2. A semiconductor chip package according to claim 1, wherein said plurality of inner leads have a plurality of second through holes formed therethrough.

3. A semiconductor chip package according to claim 1, wherein said lead frame further includes at least one bus bar having at least one third through hole formed therethrough, said at least one bus bar being adhered to said first adhesive side of said mounting tape portion.

4. A semiconductor chip package according to claim 1, wherein each first through hole formed in said mounting tape portion is 0.01 mm –0.5 mm in diameter.

5. A semiconductor chip package according to claim 1, wherein said adhesive mounting tape portion is made from a polyimide.

6. A semiconductor chip package comprising:

a lead frame lacking a die pad but having a plurality of inner leads, said plurality of inner leads having first through holes formed therethrough;

a semiconductor chip having a first surface with a circuit pattern and a second surface opposite to said first surface, said semiconductor chip being mounted on said lead frame with an adhesive mounting tape portion having first and second adhesive sides, said first adhesive side being adhered to said lead frame, said second adhesive side being adhered to said first surface of said semiconductor chip, wherein said adhesive mounting tape has a plurality of second through holes formed therethrough, said semiconductor chip being electrically connected to said plurality of inner leads, at least some of the holes through said tape being not aligned with the leads or holes through the leads; and a molding compound portion encapsulating said semiconductor chip and at least a portion of said lead frame.

7. A semiconductor chip package according to claim 6, wherein said adhesive mounting tape portion is made from a polyimide.

8. A semiconductor chip package according to claim 7, wherein said adhesive mounting tape portion is made from a polyimide.

9. A semiconductor chip package according to claim 7, wherein said lead frame further includes at least one bus bar having at least one third through hole formed therethrough.

10. A semiconductor chip package according to claim 7, wherein each second through hole is 0.01 mm –0.5 mm in diameter.

11. A semiconductor chip package according to claim 6, wherein each second through hole is 0.01 mm –0.5 mm in diameter.

12. A semiconductor chip package according to claim 6, wherein said lead frame further includes at least one bus bar having at least one third through hole formed therethrough.

13. A semiconductor chip package comprising:

a lead frame lacking a die pad but having a plurality of inner leads, said plurality of inner leads having first through holes formed therethrough;

a semiconductor chip having a first surface with a circuit pattern and a second surface opposite to said first surface, said semiconductor chip being mounted on said lead frame with an adhesive mounting tape portion having first and second adhesive sides, whereby said first adhesive side is adhered to said lead frame and said second adhesive side is adhered to said first surface of said semiconductor chip, said mounting tape portion also having a plurality of substantially uniformly distributed second through holes formed therethrough, said semiconductor chip being electrically connected to said plurality of inner leads, at least some of the holes through said tape being not aligned with the leads or holes through the leads; and a molding compound portion encapsulating said semiconductor chip and at least a portion of said lead frame.

14. A semiconductor chip package comprising:

a lead frame lacking a die pad but having a plurality of inner leads;

a semiconductor chip mounted on said lead frame with an adhesive mounting tape portion having first and second adhesive sides, said first adhesive side being adhered to said inner leads of said lead frame, said adhesive mounting tape having a plurality of first through holes formed therethrough, said second adhesive side being adhered to said semiconductor chip, said semiconductor chip being electrically connected to said plurality of inner leads, at least some of the holes through said tape being not aligned with the leads or holes through the leads; and a molding compound portion encapsulating said semiconductor chip and at least a portion of said lead frame.

15. A semiconductor chip package comprising:

a lead frame lacking a die pad but having a plurality of inner leads, said plurality of inner leads having first through holes formed therethrough;

a semiconductor chip mounted on said lead frame with an adhesive mounting tape portion having first and second adhesive sides, said first adhesive side being adhered to said inner leads of said lead frame, said second adhesive side being adhered to said semiconductor chip, wherein said adhesive mounting tape has a plurality of second through holes formed therethrough, said semiconductor chip being electrically connected to said plurality of inner leads, at least some of the holes through said tape being not aligned with the leads or holes through the leads; and a molding compound portion encapsulating said semiconductor chip and at least a portion of said lead frame.

* * * * *